United States Patent [19]

Lin et al.

[11] Patent Number: 5,229,245
[45] Date of Patent: Jul. 20, 1993

[54] POSITIVELY WORKING PHOTOSENSITIVE COMPOSITION

[75] Inventors: Dhei-Jhai Lin, Taoyuan; Hsien-Kuang Lin, Taipei; Jim-Chyuan Shieh, Miao-Li Hsien, all of Taiwan

[73] Assignee: Industrial Technology Research Institute, Taiwan

[21] Appl. No.: 736,460

[22] Filed: Jul. 26, 1991

[51] Int. Cl.$^5$ ............ C03C 1/56; C03C 1/60; G03F 7/023
[52] U.S. Cl. ................... 430/190; 430/192; 430/193; 430/285
[58] Field of Search ............... 430/190, 908, 192, 193, 430/905, 906, 910, 182, 285

[56] References Cited

U.S. PATENT DOCUMENTS

| | | | |
|---|---|---|---|
| 3,902,906 | 9/1975 | Iwama et al. | 430/192 |
| 4,876,173 | 10/1989 | Maemoto et al. | 430/910 |
| 4,925,768 | 5/1990 | Iwasaki et al. | 430/910 |

*Primary Examiner*—Charles L. Bowers, Jr.
*Assistant Examiner*—Mark F. Huff
*Attorney, Agent, or Firm*—Ladas & Parry

[57] ABSTRACT

A positively working photosensitive composition is disclosed useful for making positively working lithographic printing plates of exceptional wear, printing and solvent-resistant characteristics. The positively working photosensitive composition essentially contains a β-dicarbonyl group and a quinone diazide group.

7 Claims, No Drawings

POSITIVELY WORKING PHOTOSENSITIVE COMPOSITION

BACKGROUND OF THE INVENTION

Field of the Invention

This invention relates to a positively working photosensitive composition, more particularly to a positively working photosensitive composition which contains an acrylic copolymer and is capable of producing a positive image upon exposure to actinic radiation and subsequent treatment with a basic solution.

Description of the Related Art

It is well known that printed circuit boards include insulating boards on which flat conductive traces are formed to connect the electronic parts. Generally, the printed circuit board is made by forming an etching resist pattern onto a metal film and then etching the board in an etching solution to remove the unpatterned portion of the board. Thus, a predetermined pattern of printed wiring is obtained. This is called as a subtractive method. In the prior art, such an etching resist pattern is formed on a metal board by a screen printing method including the formation of a predetermined pattern on a screen and then printing etching resist ink onto the metal board through selected open areas in the screen. However, it is difficult to manufacture a circuit pattern that has a line with precise width because of the poor accuracy of the screen printing method.

In another method of using a high resolution photoresist, a circuit pattern that has a line with precise width may be obtained This method includes the application, exposure and development of the photoresist on a metal substrate to form an etching resist pattern. The metal substrate is then etched and the etching resist pattern is removed by the subsequent treatment of a strong basic solution Such an etching process utilizing a high resolution photoresist is known as photolithography or photo-etching.

Photoresists may be sorted into liquid and dry type photoresists. Liquid type photoresists are in liquid form before they are applied to the substrate. They may be applied to the substrate by dip coating, roller coating, spin coating or spray coating processes and then dried, which results in their adherence to said substrate. The dry type photoresists known as dry film photoresists, are in a semi-solid state and are sandwiched between a polyester film and a polyethylene film. The dry film photoresists are adhered to the metal substrate by a hot laminate method.

The photoresists may also be sorted into negative and positive photoresists according to the chemical reactive process they undertake during the exposure treatment. When the negative photoresists are exposed, the components of the negative photoresists crosslink in a polymerization reaction Therefore, the exposed portions on the substrate are not dissolved by a solvent in the development step and form an etching resist pattern. The positive photoresists produce carboxyl group which is highly soluble when exposed to a basic solution. In general, the negative photoresists shrink while being exposed and swell while being developed. Therefore, the resolution of the negative photoresists is poorer. In addition, due to an oxygen-inhibition characteristic in this process, the incomplete surface cure of photoresist will cause weaker mechanical strength and poorer etching resistance. Hence, the negative photoresists need a protective film to prevent the subsequent treatments from adversely affecting it. But this protective film sandwiched between photomask and the photoresist layer, reduces the resolution of the photoresist.

The resolution of the positive photoresists is better than that of the negative photoresists because of the elimination of the shrinkage and oxygen-exhibition effects. However, because the positive photoresists are generally composed of resins which are soluble in development solutions, (e.g. novolac resin), problems with corrosion caused by the development solution are unavoidable.

In the known art, the positively working photosensitive composition generally contains quinonediazides. The quinonediazido group is converted into a ketene group and then a carboxyl group under the exposure of UV light. In addition, the positively working photosensitive composition contains a film-forming polymer so that it can be in the form of a film. The quinonediazo group may be directly grafted to a film-forming polymer, such as the acrylic polymers disclosed in U.S. Pat. No 3,859,099 and the polyhydric phonyl resins disclosed in U.S. Pat. No. 4,306,010. A quinonediazo group may be contained in a smaller molecule which can be mixed with the film-forming polymers. Examples of such may be found in U.S. Pat. No. 3,823,130 in which quinone diazide groups are grafted to aliphatic alcohols, U.S. Pat. No. 3,869,292 in which quinone diazide groups are grafted to phenols, and U.S. Pat. No. 4,673,458 in which quinone diazide groups are grafted to 2,4-dihydroxybenzophenone or 2,3,4-trihydroxybenzophenone. Suitable film-forming polymers that can be used to mix with these quinonediazides are novolac resins vinyl phenol resins and acrylic resins, etc.

The above-mentioned positively working photosensitive composition exhibits development contrast when the quinonediazides are exposed and produce carboxyl groups. However, the film-forming resins experience no significant change after the development treatment. Hence, when used in an integral circuit microlithography process, the positively working photosensitive composition needs to be heated to the temperature above 120° C. or exposed to near UV light after the development treatment. This produces a crosslinking reaction that increases the mechanical strength so as to facilitate the subsequent treatments, such as the semiconductor etching and ion-implantation processes. That is, the positively working photosensitive composition lacks sufficient mechanical strength after the development treatment. In addition, the solvent-resistant character of the positively working photosensitive composition is not satisfactory for manufacturing the other printing plates.

SUMMARY OF THE INVENTION

It is therefore a main object of this invention to provide an improved positively working photosensitive composition which has good mechanical strength, and is solvent-resistant after the selective exposure and subsequent basic development treatment, thereby making it useful in making photoresists and printed circuit boards.

Accordingly, the positively working photosensitive composition of this invention is a quinone diazide-containing light sensitive acrylic compositions that essentially contains a film-forming acrylic copolymer which the quinone diazide group can be grafted to or mixed with after being combined with the other molecules.

The acrylic copolymer of this invention consists essentially of 3 to 100 molar percent of β-dicarbonyl group bearing repeating units (I):

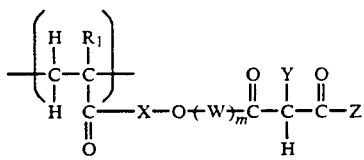

wherein

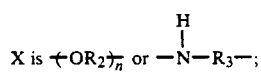

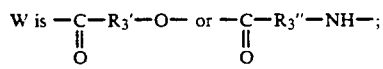

Y is hydrogen atom or alkyl group having 1 to 3 carbon atoms;

Z is hydrogen atom, —R$_4$, OR'$_4$, phenyl or —NH—R''$_4$;

R$_1$ is hydrogen atom or methyl group;

R$_2$ represents alkylene having 2 to 5 carbon atoms with or without substitution group;

R$_3$, R'$_3$, R''$_3$ represent the same or different alkylene(s) having 1 to 3 carbon atoms with or without substitution group;

R$_4$, R'$_4$, R''$_4$ represent the same or different alkylene(s) having 1 to 3 carbon atoms with or without substitution group;

n is an integer of 1 to 20; and m is an integer of 0 to 5.

The acrylic copolymer may include 0 to 97 molar percent of the other repeating units selected from the following α,β-ethylenically unsaturated monomers:

(1) alkyl acrylate or alkyl methacrylate, such as methyl acrylate, methyl methacrylate, ethyl acrylate, ethyl methacrylate, n-butyl acrylate, n-butyl methacrylate, and 2-ethylhexyl acrylate and the like;

(2) carboxyl-containing monomers, such as acrylic acid, methacrylic acid, itaconic acid, crotonic acid and maleic acid;

(3) hydroxy group bearing polymerizable monomers, such as 2-hydroxy ethyl acrylate, 2-hydroxy ethyl methacrylate, hydroxy propyl acrylate, hydroxy propyl methacrylate, hydroxy butyl acrylate and hydroxy butyl methacrylate;

(4) amino group bearing alkyl acrylate or alkyl methacrylate, such as dimethylaminoethyl acrylate and diethylaminoethyl methacrylate;

(5) amido monomers, such as acrylamide and methacrylamide;

(6) polymerizable aromatic compounds, such as styrene and phenyl acrylate; and (7) nitrile bearing monomers, such as acrylontrile and methacrylontrile.

The above-mentioned acrylic copolymers can be prepared by any one of a variety of polymerization techniques known to those skilled in the art. For example, solution, emulsion or suspension polymerization occurs readily in the presence of a polymerization initiator. The copolymers of this invention are preferably utilized within a molecular weight range from 2,500 to 200,000.

In accordance with the present invention, the quinone diazide group may be contained in the other compounds and mixed with the acrylic copolymers. For example, the quinone diazide sulfonic halides and the hydroxy group bearing compounds proceed a condensation reaction and form quinone diazide sulfonic esters. Typical examples of said hydroxy group bearing compounds are phenols or alcohols, such as hydroquinone, resorcin, 2,4-dihydroxy benezophenone, 2, 3,4-trihydroxy benezophenone, 1,4-cyclohexanediol, tretraethyleneglycol, polyethylene glycol, polyester diol, novolac resins, vinylphenol resins and the like. Examples of the quinone diazide sulfonyl halides are 1,2-benzoquinone diazide-4-sulfonyl chloride, 1,2-naphthoquinone-2-diazide-4-sulfonyl chloride and 1,2-naphthoquinone-2-diazide-5-sulfonyl chloride. The weight ratio of the acrylic copolymers and the quinone diazide sulfonic esters should be controlled in the range from 1:0.05 to 2.0.

The quinone diazide group may be grafted to a hydroxy groups bearing the acrylic copolymer which contains repeating units (I) by esterifying the hydroxy groups and the quinone diazide sulfonyl halides. The esterification product has the repeating units (II) as follows:

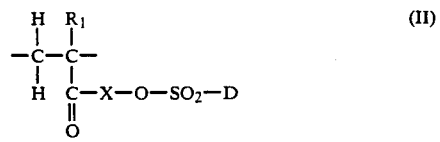

wherein

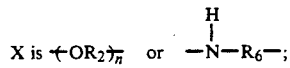

R$_1$ is hydrogen atom or methyl group;

R$_2$ represents an alkylene having 2 to 5 carbon atoms with or without substitution groups;

R$_6$ represent an alkylene having 1 to 3 carbon atoms with or without substitution groups;

n is an integer of 1 to 20; and

D is 1,2-quinone diazide group selected from the group of:

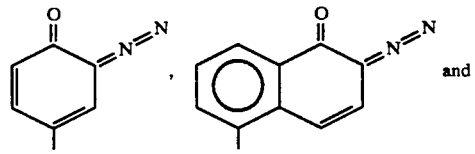

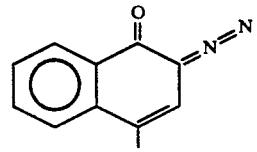

The acrylic copolymers bearing with quinone diazide groups contain 3 to 92 mole percent of repeating units (I), 8 to 40 mole percent of repeating units (II), 0 to 89 weight percent of the other repeating units which is formed from α,β-ethylenically unsaturated monomers.

It will be recognized that additional components, for example, dyes or pigments, adhesion promotors, plasticizers and solvent, can be included in the positively working photosensitive composition.

The positively working photosensitive composition can be coated onto the planar substrate by dip coating, roller coating, whirl coating or electrodeposition coating. Suitable planar substrates include aluminum, zinc, copper, steel, polyester films and polyimide films. The coating thickness should be uniform and may be controlled in the range from 0.1 to 15 μm as desired. The obtained light-sensitive film is dried at the temperature of 80 to 100° C. for 5 to 20 minutes and then covered with a film with printed patterns. Then it is exposed to a light source, for example, a high pressure mercury vapour lamp with an exposure energy of 200 to 800 mJ/cm$^2$. The exposed light-sensitive film is developed by using basic solutions, such as sodium hydroxide, sodium metasilicate, sodium carbonate, potassium hydroxide and ammonia to remove the exposed portions. Thus, the developed images are obtained.

When the patterns obtained from the light-sensitive films are applied to a printed circuits board, the bare portion of a copper substrate may be removed by suitable etching solutions, such as copper chloride, ferric chloride and sodium persulfate. After the etching of the copper wires is completed, the obtained board is processed with stronger basic solutions or polar solvents to remove the patterns of light-sensitive films from the board. Typical stronger basic solutions are sodium hydroxide and potassium hydroxide with high concentration. Examples of the polar solvents are dichloromethane and trichloromethane. Such a positively working photosensitive composition has better solvent-resistance, etching-resistance, scratch-resistance, wear-resistance and heat-resistance than those of the conventional positively working photosensitive composition.

Other features and advantages of this invention will become apparent in the following detailed description of the preferred embodiments of this invention. However, it is understood that these embodiments are not intended to restrict the scope of this invention.

DETAILED DESCRIPTION OF THE PREFERRED EMBODIMENTS

Example 1

A condenser tube, a thermometer, a feed tube and a stirring rod were respectively inserted into a four-necked reaction flask. Nitrogen gas was introduced into the reaction flask which was then heated to 100° C. 59.0 g of diethyl ketone was added into the reaction flask. After 10 minutes, a solution consisting 21.2 g of methyl methacrylate, 38.4 g of butyl acrylate, 105.2 g of acetoacetoxyethyl methacrylate, 3.2 g of acrylic acid and 1.2 g of N,N'-azobisisobutyl nitrile was added drop by drop into the reaction flask and reacted for 6 hours. An acrylic copolymer with a molecular weight of 21,000 was obtained.

A positively working photosensitive composition was prepared by mixing 133.0 g of the obtained acrylic copolymer, 13.5 g of 2,3,4-tri(1,2-naphthoquinone-2-diazido-5-sulfonyloxy)benzophenone, 350.0 g diethyl ketone and 550.0 g of propylene glycol monomethyl ether. The positively working photosensitive composition was applied to a copper substrate board by the dip coating method and dried at the temperature of 90° C. for 10 minutes. The resulting light-sensitive film was covered with a photomask and exposed to a light source having an exposure energy of 400 mJ/cm$^2$, and then washed by 1% of sodium metasilicate aqueous solution. A yellowish brown pattern gradually turned into a clearly red pattern on the copper board. The resulted patterns were scratch-resistant and wear-resistant. The pencil hardness is up to 6 H. The surface of the resulted patterns were not etched when the board was dipped in isopropyl alcohol for 30 minutes, showing a good solvent-resistance.

Example 2 (Comparative)

A condenser tube, a thermometer, a feed tube and a stirring rod were respectively inserted into a four-necked reaction flask. Nitrogen gas was introduced into the reaction flask which was then heated to 100° C. 59.0 g of diethyl ketone was added into the reaction flask. After 10 minutes, a solution consisting 72.2 g of methyl methacrylate, 92.5 g of butyl acrylate, 3.2 g of acrylic acid and 1.2 g of N,N'-azobisisobutyl nitrile was added drop by drop into the reaction flask and reacted for 6 hours. An acrylic copolymer with a molecular weight of 22,000 was obtained.

A positively working photosensitive composition was prepared by mixing 133.0 g of the obtained acrylic copolymer, 13.5 g of 2,3,4-tri(1,2-naphthoquinone-2-diazido-5-sulfonyloxy)benzophenone, 350.0 g diethyl ketone and 550.0g propylene glycol monomethyl ether. The positively working photosensitive composition was applied to a copper substrate board by the dip coating method and dried at the temperature of 90° C. for 10 minutes. The resulting light-sensitive film was covered with a photomask and exposed to a light source having an exposure energy of 400 mJ/cm$^2$ and then washed by 1% of sodium metasilicate aqueous solution. A pattern was formed on the copper board. The resulted pattern had a poor scratch-resistant and wear-resistant character in comparison with that of Example 1. The pencil hardness is only up to 2 H. The surface of the resulted pattern swelled and was soon thereafter dissolved in isopropyl alcohol. Hence, the solvent-resistance of this positively working photosensitive composition is poorer than that of Example 1.

Example 3

A condenser tube, a thermometer, a feed tube and a stirring rod were respectively inserted into a four-necked reaction flask. Nitrogen gas was introduced into the reaction flask which was then heated to 100° C. 63.7 g of methylisobutyl ketone was added to the reaction flask. After 10 minutes, a solution consisting 34.8 g of methyl acrylate, 25.6 g of butyl acrylate, 64.2 g of acetoacetoxyethyl methacrylate, 23.6 g of 2-hydroxyethyl methacylate and 2.0 g of N,N'-azobisisobutyl nitrile was added drop by drop into the reaction flask and reacted for 6 hours. An acrylic copolymer with a molecular weight of 13,000 was obtained.

57.1 g of the obtained acrylic copolymer was mixed with 6.5 g of triethylamine and 10.0 g of ketone in the reaction flask. A solution consisting 16.3 g of 1,2-naphthoquinone-2-diazido-5-sulfonyl chloride and 100.0 g of acetone was added drop by drop into the reaction flask for 4 hours. The product was placed into 1% of HCl solution, stirred and precipitated. The precipitates were removed and washed with de-ionized water and a yellowish brown resin was obtained. A positively working photosensitive composition was prepared by dissolving the obtained yellowish brown resin in 200.0 g of methyl ethyl ketone and 450.0 g of ethylene glycol ethyl ether. The positively working photosensitive composition was applied to a copper substrate board by the dip coating method and dried at the temperature of 90° C. for 10 minutes. The resulting light-sensitive film was covered with a photomask, exposed to light source having an exposure energy of 500 mJ/cm² and then washed by 1% of sodium metasilicate aqueous solution. A yellowish brown pattern gradually turned into a clearly red pattern on the copper board. The resulted patterns were scratch-resistant and wear-resistant. The surface of the resulted patterns were not etched when the board was dipped in isopropyl alcohol for 30 minutes, showing a good solvent-resistance. The light-sensitive film was still adhered to the board without the formation of pinholes after being etched by sodium persulfate aqueous solution. The copper wires were formed after the light-sensitive film was removed by dichloromethane.

Example 4

A condenser tube, a thermometer, a feed tube and a stirring rod were respectively inserted into a four-necked reaction flask. Nitrogen gas was introduced into the reaction flask which was then heated to 100° C. 77.9 g of diethyl ketone was added to the reaction flask. After 10 minutes, a solution consisting 50.0 g of methyl methacrylate, 38.4 g of butyl acrylate, 28.4 g of glycidyl methacrylate and 1.5 g of N,N'-azobisisobutyl nitrile was added drop by drop into the reaction flask and reacted for 6 hours. 31.8 g of N-(acetoacetyl) glycine and 0.3 g of N,N'-diethyl aniline were reacted for 4 hours. An acrylic copolymer with a molecular weight of 17,000 was obtained.

A positively working photosensitive composition was prepared by mixing 228.0 g of the obtained acrylic copolymer, 29.7 g of 2,4-di(1,2-naphthoquinone-2-diazido-5-sulfonyloxy)benzophenone, 920.0 g butyl acetate and 700.0 g of methyl isobutyl ketone. The positively working photosensitive composition was applied to a copper substrate board by the dip coating method and dried at the temperature of 90° C. for 10 minutes. The resulting light-sensitive film was covered with a photomask, exposed to a light source having an exposure energy of 500 mJ/cm² and then washed by 1% of sodium metasilicate aqueous solution. A yellowish brown pattern gradually turned into a clearly red pattern on the copper board. The resulted pattern was scratch-resistant and wear-resistant. The surface of the resulted patterns were not etched when the board was dipped in isopropyl alcohol for 30 minutes, showing a good solvent resistance. The light-sensitive film still adhered to the board without the formation of pinholes after being etched by sodium persulfate aqueous solution. The copper wires were formed after the light-sensitive film was removed by dichloromethane.

Example 5

A condenser tube, a thermometer, a feed tube and a stirring rod were respectively inserted into a four-necked reaction flask. Nitrogen gas was introduced into the reaction flask which was then heated to 100° C. 57.0 g of propylene glycol mono ethyl ester was added to the reaction flask. After 10 minutes, a solution consisting 26.0 g of methyl methacrylate, 30.1 g of methyl acrylate, 25.0 g of acttoacetoxy methacrylate, 2.9 g of acrylic acid and 1.5 g of N,N'-azobisisobutyl nitrile was added drop by drop to the reaction flask and reacted for 6 hours. An acrylic copolymer with a molecular weight of 18,000 was obtained.

A positively working photosensitive composition was prepared by mixing 133.0 g of the obtained acrylic copolymer, 32.2 g of tetraethleneglycol-di-1,2-naphthoquinone-2-diazido-4-sulfonate, 900.0 g methyl ethyl ketone and 1300.0 g of ethylene glycol mono ethyl ether. The positively working photosensitive composition was applied to a copper substrate board by the dip coating method and dried at the temperature of 90° C. for 10 minutes. The resulting light-sensitive film was covered with a photomask, exposed to a light source having an exposure energy of 400 mJ/cm² and then washed by 1% of sodium metasilicate aqueous solution. A clearly dark red pattern was formed on the copper board. The resulted pattern was scratch-resistant and wear-resistant. The surface of the resulted pattern was not etched when the board was dipped in isopropyl alcohol for 30 minutes, showing a good solvent-resistance. Hence, this positively working photosensitive composition is an excellent material for printing plates.

With this invention thus explained, it is apparent that numerous modifications and variations can be made without departing from the scope and spirit of this invention. It is therefore intended that this invention be limited only as indicated in the appended claims.

I claim:

1. A positively working photosensitive composition capable of producing a positive image upon exposure to actinic radiation and subsequent treatment with a basic solution, comprising:

(a) an acrylic copolymer consisting essentially of, on a molar basis, from 3 to 100 percent of β-dicarbonyl group bearing repeating units (I)

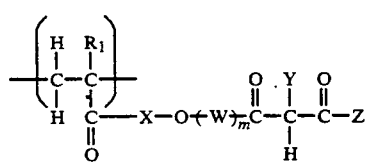

wherein

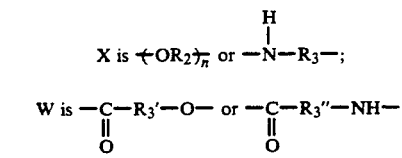

Y is hydrogen atom or alkyl group having 1 to 3 carbon atoms;

Z is hydrogen atom, —R$_4$, —OR'$_4$, phenyl or —NH—R''$_4$;

R$_1$ is hydrogen atom or methyl group;

R$_2$ represents alkylene having 2 to 5 carbon atoms with or without substitution group;

R$_3$, R'$_3$, R''$_3$ represent the same or different alkylene(s) having 1 to 3 carbon atoms with or without substitution group;

R$_4$, R'$_4$, R''$_4$ represent the same or different alkylene(s) having 1 to 3 carbon atoms with or without substitution group;

n is an integer of 1 to 20; and m is an integer of 0 to 5; and (b) 1,2-quinonediazido sulfonyl group bearing compound.

2. A positively working photosensitive composition as claimed in claim 1, wherein said acrylic copolymer exhibits a molecular weight ranging from 2,500 to 200,000.

3. A positively working photosensitive composition as claimed in claim 1, wherein said acrylic copolymer comprises from 97 to 0 percent of repeating units which is formed from the α,β-ethylenically unsaturated monomers of alkyl acrylate, alkyl methacrylate, carboxyl-containing monomers, hydroxy group bearing polymerizable monomers, amino group bearing alkyl acrylate, or methacrylate, amido monomers, polymerizable aromatic compounds and nitrile bearing monomers.

4. A positively working photosensitive composition as claimed in claim 1, wherein said 1,2-quinonediazido sulfonyl group bearing compound is from 0.05 to 2.0 parts by weight of per part of said acrylic copolymer.

5. A positively working photosensitive composition capable of producing a positive image upon exposure to actinic radiation and subsequent treatment with a basic solution, comprising a light-sensitive acrylic copolymer consisting essentially of, on a molar basis, (a) from 3 to 92 percent of β-dicarbonyl group bearing repeating units (I)

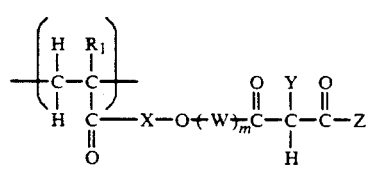

wherein

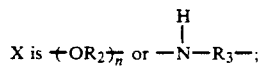

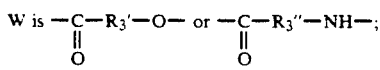

Y is hydrogen atom or alkyl group having 1 to 3 carbon atoms;

Z is hydrogen atom, —R$_4$, —OR'$_4$, phenyl group or —NH—R''$_4$;

R$_1$ is hydrogen atom or methyl group; R$_2$ represents alkylene having 2 to 5 carbon atoms with or without substitution group;

R$_3$, R'$_3$, R''$_3$ represent the same or different alkylene(s) having 1 to 3 carbon atoms with or without substitution group;

R$_4$, R'$_4$, R''$_4$ represent the same or different alkylene(s) having 1 to 3 carbon atoms with or without substitution group;

n is an integer of 1 to 20; and m is an integer of 0 to 5;

(b) from 8 to 40 percent of quinone diazide group bearing repeating units (II)

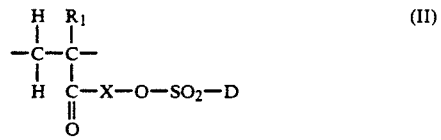

wherein

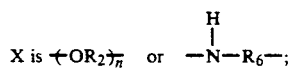

R$_1$ is hydrogen atom or methyl group;

R$_2$ represents alkylene having 2 to 5 carbon atoms with or without substitution group;

R$_6$ represent the alkylene having 1 to 3 carbon atoms with or without substitution groups;

n is an integer of 1 to 20; and

D is 1,2-quinone diazide group selected from the group of:

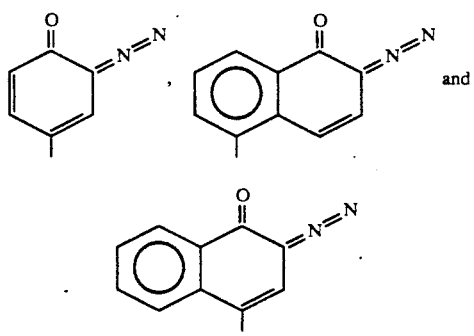

6. A positively working photosensitive composition as claimed in claim 5, further comprising from 0 to 89 percent of repeating units which is formed the α,β-ethylenically unsaturated monomers group of alkyl acrylate, alkyl methacrylate, carboxyl-containing monomers, hydroxy group bearing polymerizable monomers, amino group bearing alkyl acrylate, or methacrylate, amido monomers, polymerizable aromatic compounds and nitrile bearing monomers.

7. A positively working photosensitive composition as claimed in claim 5, wherein said acrylic copolymer exhibits a molecular weight ranging from 2,500 to 200,000.

* * * * *